United States Patent [19]

Ketcham

[11] Patent Number: 4,768,286

[45] Date of Patent: Sep. 6, 1988

[54] PRINTED CIRCUIT PACKAGING FOR HIGH VIBRATION AND TEMPERATURE ENVIRONMENTS

[75] Inventor: Carl Ketcham, West Valley City, Utah

[73] Assignee: Eastman Christensen Co., Salt Lake City, Utah

[21] Appl. No.: 913,960

[22] Filed: Oct. 1, 1986

[51] Int. Cl.⁴ .............................................. H05K 3/30
[52] U.S. Cl. .................................................... 29/841
[58] Field of Search ......................... 29/841, 855, 856; 264/272.14, 272.11, 45.5

[56] References Cited

U.S. PATENT DOCUMENTS 3,579,821  5/1971  Kurisu ..................................... 29/841
4,063,349 12/1977  Passler et al. ......................... 29/841
4,118,861 10/1978  Palmisano ....................... 264/272.11

FOREIGN PATENT DOCUMENTS 2347049  2/1975  Fed. Rep. of Germany ........ 29/841
3005507  8/1981  Fed. Rep. of Germany ........ 29/841
2398432  3/1979  France .................................... 29/841

Primary Examiner—William R. Briggs

Attorney, Agent, or Firm—Beehler, Pavitt, Siegemund, Jagger, Martella & Dawes

[57] ABSTRACT

A method for manufacturing a reusable package for printed circuits boards in oil tools which is protected from high vibration and high temperature environments is comprised of the steps of vacuum forming a thin layer of mold release film over the printed circuit board. The printed circuit board together with its intimately formed mold release film is then potted in a conventional manner within a protective package filled with a resilient curable foam. The foam is poured in an uncured state around the components of the printed circuit board and cured in place. After the potting material is cured the printed circuit board is removed from the resilient potting material and the mold release layer is stripped from the printed circuit board. Thereafter the printed circuit board is reassembled in the conformally molded resilient potting and additional foam may be added to the printed circuit board and the electronic packaging to gently urge the printed circuit board into intimate conformal contact with the conformally mated potting. The electronic package is then completed or enclosed in a conventional manner with the printed circuit board snugly retained within the conformally molded potting.

4 Claims, 1 Drawing Sheet

PRINTED CIRCUIT PACKAGING FOR HIGH VIBRATION AND TEMPERATURE ENVIRONMENTS

BACKGROUND OF THE INVENTION

1. Field of the Invention

The invention relates to the field of earth boring tools and more particularly to packaging for printed circuit boards in earth boring tools which are subject to high vibration and temperature environments.

2. Description of the Prior Art

Printed circuits used in high temperature and high vibration environments, like in downhole oil tools, must be insulated or protected from high vibration levels and temperatures or else circuit failure is highly probable. Traditionally the circuits are simply potted in their circuit packaging with a rigid molded in place insulator. However, if a circuit element fails or any type of circuit modification is required, the potting must be laboriously chipped away, sandblasted or dissolved without damaging those circuit elements which are sought to be saved. This has resulted in the virtual impracticability of repair or modification on any downhole circuit package.

In an attempt to over come this limitation of prior art packaging techniques, practitioners have packed a circuit package with a resilient foam or filler instead of a molded-in-place dielectric. This results in various ones of the components on the printed circuit board bearing a higher load than other elements. The result is that the more highly loaded circuit components tend to be damaged by high vibration causing premature failure.

What is needed is a method and packaging which will protect a printed circuit from heat and vibration loads, which will allow easy repair or modification, and which will not result in premature failure of any of the circuit elements.

BRIEF SUMMARY OF THE INVENTION

The invention is a method for packaging an electronic circuit comprising the steps of disposing a mold release agent on the circuit. A resilient potting material is then disposed in contact with the mold release agent and is thus intimately conformed to the physical surfaces of the circuit. The potted circuit is then disposed into a circuit package. As a result of these steps the circuit is protected from external temperatures and insulated from high vibration while being removable from the potting material for alteration or repair and reinsertable in the potting material without loss of temperature protection or vibration isolation.

The method further comprising the steps of removing the circuit from the potting material, removing the mold release agent from the circuit, and disposing the circuit into the potting material. The potting material is maintained in intimate conformal physical contact with the circuit.

The method further comprising the step of disposing an element within the circuit package for urging the circuit into intimate physical contact with the conformally molded potting material.

In particular in the step of disposing the mold release agent on the circuit, a plastic film is laid in intimate contact with the the circuit. In the step of laying the plastic film in intimate contact with the circuit, the plastic film is vacuum formed about on the surface of the circuit. In the step of removing the mold release agent from the circuit, the plastic film is peeled from the physical surfaces of the circuit. In the step of disposing the resilient potting material in intimate contact with the physical surfaces of the circuit, the potting material is in an uncured liquid state and the circuit is embedded into the uncured liquid potting material. The potting material is then cured to form a resilient solid in intimate contact with the circuit covered by the mold release agent.

The potting material, when uncured and in liquid form, is poured into the packaging for the printed circuit. The packaging forms a receptacle for the uncured liquid potting material. The circuit, having the mold release agent disposed thereon, is then immersed into the uncured liquid potting material contained within the packaging. The liquid uncured potting material is then cured with the printed circuit in place.

In the step of disposing the element for urging the printed circuit board into intimate contact with the physical surfaces of the circuit, a resilient foam layer is disposed within the packaging to gently and uniformly press the circuit into the conformally molded and mating cured solid potting material.

In the step of pressing the circuit into the potting material, the foam layer is disposed between one surface of the circuit and the packaging, the potting material being disposed on the opposite side of the circuit between the circuit and the packaging.

The invention can also be characterized as a method for protecting a circuit against high vibration loads while permitting easy access thereto to repair, comprising the steps of vacuum forming a thin plastic layer over each surface of the circuit provided with components extending from the printed circuit board. Uncured liquid potting material is poured into a package for the printed circuit board. Each surface of the printed circuit board having components extending therefrom is completely immersed into the uncured liquid potting material contained within the package. The liquid potting material is then cured to transform the potting material into a resilient solid. The printed circuit board is removed from the cured resilient solid potting material. The vacuum formed plastic is removed from the printed circuit board and components thereon. The printed circuit board with the plastic film removed is redisposed into the resilient solid potting material in such a manner that the circuit board intimately and conformally mates with corresponding surfaces defined within the potting material during the step of immersing and curing. The packaging for the printed circuit board is then completed. As a result, the printed circuit board and components thereon is provided with a removable conformally mating resilient potting covering within a packaging to protect it from high vibration and shock.

The method further comprising the steps of opening the packaging, removing the printed circuit board from the resilient potting material, repairing the printed circuit board, and reinserting the repaired printed circuit board into the resilient potting material. The components on the printed circuit board, including repaired components, if any, are disposed in intimate contact with mating surfaces defined in the potting material during the steps of immersing and curing. As a result intimate contact and protection from vibration and shock is maintained for the printed circuit board even after repair and whereby repair is facilitated without compromising package protection of the the circuit.

The invention is also a package for protection of a circuit board with components thereon having physical surfaces extending from the printed circuit board. The packaging protects the printed circuit board and components from vibration and shock. The packaging comprises an external rigid hard package for enclosing the printed circuit board and components; and a resilient solid potting material substantially filling the rigid package and in intimate physical contact with the printed circuit board and components. The resilient potting material is nonadherent to the printed circuit board and components and yet makes intimate physical contact with physical surfaces of the printed circuit board and components.

The printed circuit board may thus be removed from the resilient potting material and package, repaired and reinserted into the potting material and package without loss of intimate physical contact with the potting material with each of the components on the printed circuit board so that protection from vibration and shock is maintained.

The invention can still further be characterized as a package for protection of a printed circuit board and components. The printed circuit board and components are protected from shock and vibration while allowing ease of access for repair. The packaging is fabricated by the steps of disposing a mold release agent into intimate contact on the circuit, disposing a resilient potting material into intimately conformed contact with the mold release agent, and disposing the potted circuit in a circuit package. As a result the circuit is protected from the external environment and insulated from high vibration while being removable from the potting material for alteration or repair and reinsertable in the potting material without loss of protection or vibration isolation.

The invention and its various embodiments will be better understood by now turning to the following detailed description.

DETAILED DESCRIPTION OF THE PREFERRED EMBODIMENTS

A method for manufacturing a reusable package for printed circuit boards in oil tools which is protected from high vibration and high temperature environments is comprised of the steps of vacuum forming a thin layer of mold release film over the printed circuit board. The printed circuit board together with its intimately formed mold release film is then potted in a conventional manner within a protective package filled with a resilient curable foam. The foam is poured in an uncured state around the components of the printed circuit board and cured in place. After the potting material is cured the printed circuit board is removed from the resilient potting material and the mold release layer is stripped from the printed circuit board. Thereafter the printed circuit board is reassembled in the conformally molded resilient potting and additional foam may be added to the printed circuit board and the electronic packaging to gently urge the printed circuit board into intimate conformal contact with the conformally mated potting. The electronic package is then completed or enclosed in a conventional manner with the printed circuit board snugly retained within the conformally molded potting.

What is described is a method for potting printed circuit boards within an electronics package in such a manner that the printed circuit board can be readily removed from the potting material and repaired. Thereafter, the printed circuit board and the original potting are repackaged without any loss in the vibration and temperature isolation of the printed circuit board within the packaging. Furthermore, the potting is customized to the idiosyncrasies of each printed circuit board so that no high stress points are developed on the printed circuit either initially or at any subsequent time such as when the board is repaired and reinserted into the original packaging.

Figure 1:
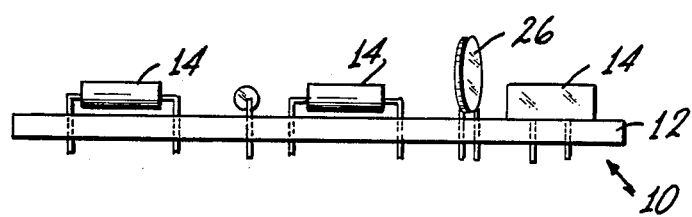
FIG. 1 is a diagrammatic side elevational view of a printed circuit board upon which a plurality of discrete and integrated circuit boards have been disposed in a conventional manner.

Turn first to FIG. 1 wherein a side elevational view of printed circuit board, generally denoted by reference numeral 10, is illustrated. Printed circuit board 10 is comprised of a rigid board 12 upon which a plurality of electronic components, generally denoted by reference numeral 14 has been depicted. Components 14 may be discrete electric components such as resistors, capacitors, transistors, transformers and the like and may include integrated circuit packaging or other modular electronic packages.

Figure 2:
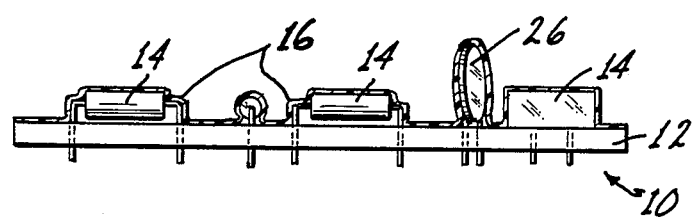
FIG. 2 is a side elevational view of the circuit board of FIG. 1 after a mold release layer, such as a plastic film, has been vacuum filmed over the board.

Printed circuit board 10 is prepared in a conventional manner for potting, such as including strain relief components, conformal coatings and the like. As shown in FIG. 2, printed circuit board 10 is then placed within an conventional vacuum filming apparatus (not shown) and covered by a thin layer of plastic film 16 which serves as a mold release layer. Film layer 16 is set downwardly onto printed circuit board 10 so that it intimately conforms with each individualized dimension of printed circuit board 10 and components 14 thereon.

Figure 3:
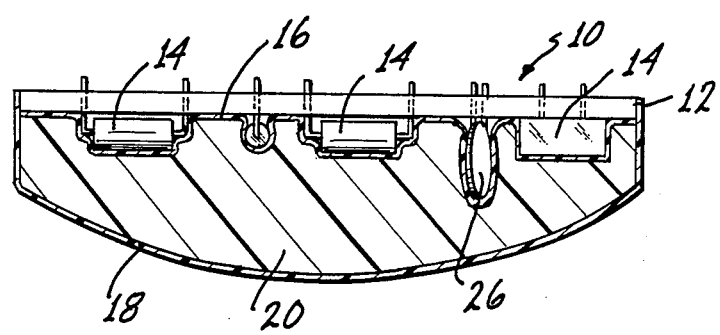
FIG. 3 is a depiction of the circuit board of FIGS. 1 and 2 embedded into a potting compound held within a container.

After plastic film 16 is formed over printed circuit board 10, it is placed within a conventional electronics package, diagrammatically depicted in FIG. 3 by a metallic can 18. Uncured potting is disposed within can 18 and around the plastic covered printed circuit board 10 in a conventional manner. Potting 20 is a foam material which provides both thermal and vibration isolation for printed circuit board 10 with respect to the external environment to which can 18 is subjected. Uncured, potting 10 is liquid and has a viscosity which allows it to flow intimately into contact with the contoured plastic film 16 and thus forms a customized three-dimensional, molded fitting for printed circuit board 10.

Figure 4:
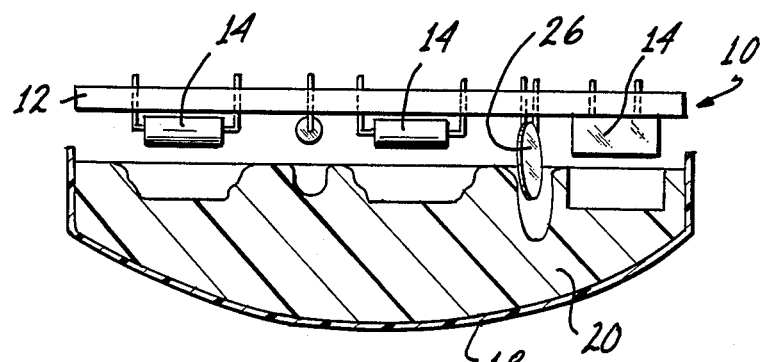
FIG. 4 is the depiction of FIG. 3 showing the circuit board and potting material separated after removal of the mold release layer.

After potting 20 has cured, printed circuit board 10 is then removed and plastic layer 16 stripped from printed circuit board 10. Removal of printed circuit board 10 from the cured potting 20 is possible because of the mold releasing properties of plastic film 16. As shown in FIG. 4, printed circuit board 10 is then physically separated from its conformally shaped potting 20 within can 18. The natural resiliency of potting 20 permits any undercutting of potting material formed around the components on printed circuit board 10 to be relieved and thereby permit the removal of printed circuit board 10. Similarly, printed circuit board 10 can be reassembled with or reinserted into its conformally mating potting 20 after removal of film 16 by reason of the limited amount of natural resiliency within potting 20.

Figure 5:
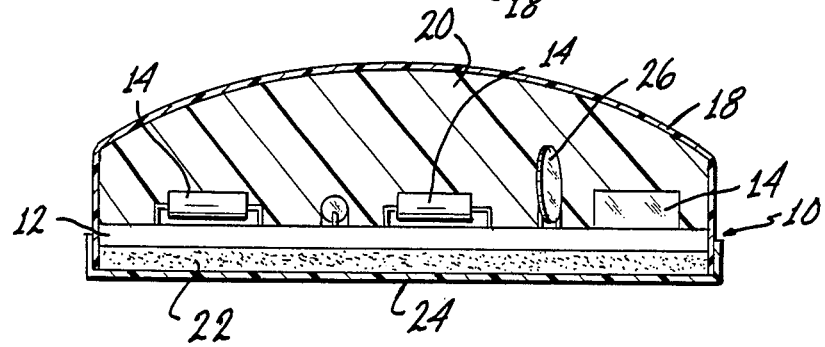
FIG. 5 is a cross-sectional depiction of the board of FIG. 4 reinserted into the potting material encased within the final electronic packaging.

Printed circuit board 10 is then reassembled into its mating potting 20 as best depicted in FIG. 5 and an elastomeric or foam cushioned layer 22 is disposed beneath printed circuit board 10 and a bottom lid 24, which together with can 18, provides a complete metallic encapsulation of printed circuit board 10. The thickness and resiliency of foam layer 22 is sufficient to press printed circuit board 10 snugly into the conformally mating indentations molded into potting 20. Lid 24 is then affixed with gaskets, screws, rivets or other conventional means to can 18 to form a secure overall package. The package can then be inserted into an oil tool and utilized downhole. Because the conformally mated potting 20 is precisely molded to the idiosyncrasies of printed circuit board 10, there is no point at which large amounts of stress are permitted to build up on any one circuit component.

On the other hand, if during the operation any element of printed circuit board 10 should fail, the oil tool can be retrieved from the well surface and the electronic package removed and disassembled in the field. Upon disassembly of the package shown in FIG. 5, for example, rear lid 24 is removed together with foam pad 22. Printed circuit board 10 can then be easily removed from its conformally mated potting 20 in the same manner as depicted during its original assembly in FIG. 4. Printed circuit board 10 can then be repaired with new components added. For the most part, the new components will have an identical shape and size as the components which they replace. In cases where IC's or modular electronic packages are soldered to printed circuit board 10, the size and orientation of the packaging is standard and the mere soldering of a replacement part to printed circuit board 10 virtually insures appropriate alignment. In the case of discrete components, such as capacitor 26 as shown in FIG. 1 extending from printed circuit board 10, the orientation of the capacitor can be standardized in practice to a specified position, such as either parallel or perpendicular to printed circuit board 10 so that reinsertion into the potting 20 is easily reproduced. Potting 20 also tends to align flexibly extending components, such as disk capacitors, to their original orientation defined in potting 20.

Therefore, in contrast to the prior art, the electronics package may be retrieved, disassembled, repaired and quickly reassembled in the field without the necessity of repotting the package. It is always possible that in the case of very dramatic alterations in printed circuit board 10 that it may be repotted as described in connection with FIGS. 1-5. However, most repairs, particularly repairs performed on the well platform, will leave printed circuit board 10 in substantially the same physical configuration as its original assembly. In this case, the board can be repaired at the well site and reassembled within a very short time period. At the same time, the shock insulation and thermal insulation properties of the originally prepared conformally mated potting 20 is substantially retained intact with respect to the newly repaired printed circuit board.

Many modifications and alterations may be made by those having ordinary skill in the art without departing from the scope and spirit of the invention. Therefore, it must be understood that the illustrated embodiment has been set forth only for the purposes of example and not by way of limitation of the invention which is defined by the following claims.

I claim:

1. A method for packaging an electronic circuit comprising the steps of:
   disposing a mold release agent on said circuit;
   disposing a resilient potting material, said resilient potting material in said mold release agent being intimately conformed to said physical surfaces of said circuit; and
   disposing said potted circuit in a circuit package,
   whereby said circuit is protected from external temperatures and insulated from high vibration while being removable from said potting material for alteration or repair and reinsertable in said potting material without loss of temperature protection or vibration insolation,
   further comprising the step of:
   removing said circuit from said potting material;
   removing said mold release agent from said circuit; and
   disposing said circuit into said potting material, said potting material maintaining intimate conformal physical contact with said circuit,
   further comprising the step of:
   disposing means within said circuit package for urging said circuit into intimate physical contact with said conformally molded potting material,
   where in said step of disposing said means for urging said printed circuit board into intimate contact with said physical surfaces of said circuit, a resilient foam layer is disposed within said packaging to gently and uniformly press said circuit into said conformally molded and mating cured solid potting material.

2. The method of claim 1 where in said step of pressing said circuit into said potting material, said foam layer is disposed between one surface of said circuit and said packaging, said potting material being disposed on the opposite side of said circuit between said circuit and said packaging.

3. A method for protecting a circuit against high vibration loads while permitting easy access thereto to repair, comprising the steps of:
   vacuum forming a thin plastic layer over each surface of said circuit provided with components extending from said printed circuit board;
   pouring uncured liquid potting material into a package for said printed circuit board;
   completely immersing each surface of said printed circuit board having components extending therefrom into said uncured liquid potting material contained within said package;
   curing said liquid potting material to transform said potting material into a resilient solid;
   removing said printed circuit board from said cured resilient solid potting material;
   removing said vacuum formed plastic from said printed circuit board and components thereon;
   redisposing said printed circuit board with said plastic film removed into said resilient solid potting material in such a manner that said circuit board intimately and conformally mates with corresponding surfaces defined within said potting material during said step of immersing and curing; and completing said packaging for said printed circuit board, whereby said printed circuit board and components thereon is provided with a removable conformally mating resilient potting covering within a packaging to protect it from high vibration and shock, further comprising the step of disposing a separate foam layer between said printed circuit board and said packaaging to urge said printed board and components thereon into intimate and secure physical contact with said resilient potting material.

4. The method of claim 3 further comprising the steps of:

opening said packaging;

removing said printed circuit board from said resilient potting material;

repairing said printed circuit board;

reinserting said repaired printed circuit board into said resilient potting material, said components on said printed circuit board including repaired components, if any, being disposed in intimate contact with mating surfaces defined in said potting material during said steps of immersing and curing; and redisposing said foam layer into said package, whereby intimate contact and protection from vibration and shock is maintained for said printed circuit board even after repair and whereby repair is facilitated without compromising the package protection of said circuit.

* * * * *